United States Patent
Cheng et al.

(10) Patent No.: US 11,959,983 B2
(45) Date of Patent: Apr. 16, 2024

(54) BODY COIL TUNING CONTROL DEVICE AND MAGNETIC RESONANCE SYSTEM

(71) Applicant: Siemens Healthcare GmbH, Erlangen (DE)

(72) Inventors: Hong Cheng, Shenzhen (CN); Stefan Pott, Nuremberg (DE); Franz Eiermann, Rattelsdorf (DE)

(73) Assignee: Siemens Healthineers AG, Erlangen (DE)

( * ) Notice: Subject to any disclaimer, the term of this patent is extended or adjusted under 35 U.S.C. 154(b) by 146 days.

(21) Appl. No.: 17/827,471

(22) Filed: May 27, 2022

(65) Prior Publication Data
US 2022/0390537 A1    Dec. 8, 2022

(30) Foreign Application Priority Data

May 31, 2021   (CN) .......................... 202110601679.X

(51) Int. Cl.
  *G01V 3/00*   (2006.01)
  *G01R 33/36*  (2006.01)
  *H02M 3/158*  (2006.01)

(52) U.S. Cl.
  CPC ............ *G01R 33/36* (2013.01); *H02M 3/158* (2013.01)

(58) Field of Classification Search
  CPC .............. G01R 33/3415; G01R 33/543; G01R 33/5659; G01R 33/36; A61B 5/055
  USPC ......................................................... 324/322
  See application file for complete search history.

(56) References Cited

U.S. PATENT DOCUMENTS

2023/0349990 A1*  11/2023  Tong ...................... A61B 5/055

* cited by examiner

*Primary Examiner* — Walter L Lindsay, Jr.
(74) *Attorney, Agent, or Firm* — Banner & Witcoff Ltd.

(57) ABSTRACT

Body coil tuning control device having: DC-DC converter with input connected to a DC power supply of an MRI system and output connected to input of an LDO, output of the LDO connected to first connection of a first resistor group; a first opamp with non-inverting input connected to first connection of the first resistor group, inverting input connected to the second connection of the first resistor group, and output connected to gate of a MOSFET array; and a negative feedback circuit connected between the output and the non-inverting input of the first opamp. The MOSFET array has a drain connected to the second connection of the first resistor group and a source connected to the input of the body coil of the MRI system. After the output signal of the first opamp is input to the gate of the MOSFET array, the source outputs a constant preset current.

14 Claims, 10 Drawing Sheets

US 11,959,983 B2

BODY COIL TUNING CONTROL DEVICE AND MAGNETIC RESONANCE SYSTEM

TECHNICAL FIELD

The present disclosure relates to the technical field of magnetic resonance (MR) systems, more particularly, a body coil tuning control device and an MR system.

BACKGROUND

For the magnetic resonance imaging (MRI) system of 1.5 T (Tesla), 3 T, or even higher, the body coil tuning/demodulation controller (BC_DYN) uses the 15V DC power supply as a current source, with the rated current of 5 A and the voltage drop up to 10V, which means that the power consumption of the BC_DYN switching BJT transistor is about 50 W, and the switching transistor requires forced air or water cooling.

In the low field MRI system, if such BC_DYN design is adopted, the PIN diode will bear a greater RF stress under the same DC bias current as the frequency decreases. Therefore, the DC current of the PIN diode in the body coil needs to be increased in the low field application, which will also lead to higher power consumption of the BJT transistor.

SUMMARY

In view of this, the aspects of the present disclosure provide a body coil tuning control device to reduce the power consumption and cost of said body coil tuning control device;

The aspects of the present disclosure also provide an MR system to reduce the power consumption and cost of said body coil tuning control device.

The technical solution of the aspects of the present disclosure is realized as follows:

A body coil tuning control device, which comprises: a DC-DC converter, a first low dropout linear regulator (LDO), a first resistor group, a first operational amplifier, a negative feedback circuit, and a metal-oxide semiconductor field effect transistor (MOSFET) array, and said first resistor group comprises one resistor or multiple series resistors, wherein:

said DC-DC converter has an input terminal connected to the DC power supply of a magnetic resonance (MRI) system and an output terminal connected to the input terminal of said first LDO, and said DC-DC converter is used to reduce the voltage of the input DC signal to a preset first voltage;

the output terminal of said first LDO is connected to the first connection terminal of said first resistor group, and the output voltage of said first LDO is smaller than the first voltage;

said first operational amplifier has an inverting input terminal connected to the first connection terminal of said first resistor group and a non-inverting input terminal connected to the second connection terminal of said first resistor group;

the output terminal of said first operational amplifier is connected to the gate G of said MOSFET array;

said negative feedback circuit is connected between the output terminal and the inverting input terminal of said first operational amplifier;

said MOSFET array has drains D connected to the second connection terminals of said first resistor group, and sources S connected to the input terminal of the body coil of said MRI system;

wherein said negative feedback circuit meets the following requirement: after the output signal of said first operational amplifier is input to the gate G of said MOSFET array, the source S of said MOSFET array can output a constant preset current;

each MOSFET in said MOSFET array is connected in parallel, and the number of MOSFETs meets the following requirement: the power of each MOSFET is smaller than the preset power.

Said negative feedback circuit comprises: a first capacitor, a first resistor, and a second resistor, wherein:

the first connection terminal of said capacitor is connected to the inverting input terminal of said first operational amplifier, and the second connection terminal of said first capacitor to the first connection terminal of said first resistor;

the second connection terminal of said resistor is connected to the output terminal of said first operational amplifier;

said second resistor is connected in parallel between the first connection terminal of said first capacitor and the second connection terminal of said first resistor;

the capacitance value of said first capacitor and the resistance values of said first resistor and said second resistor meet the following requirement: after being input to the gate G of said MOSFET array, the output signal of said first operational amplifier enables the source S of said MOSFET array to output a constant preset current.

Said device further comprises: a second operational amplifier, a third resistor, a fourth resistor, a third operational amplifier, a fifth resistor, and a sixth resistor, wherein:

the non-inverting input terminal of said second operational amplifier is connected to the first connection terminal of said first resistor group through said third resistor and is meanwhile grounded through said fourth resistor;

the inverting input terminal of said second operational amplifier is connected to the second connection terminal of said first resistor group;

the non-inverting input terminal of said third operational amplifier is connected to the second connection terminal of said first resistor group;

the inverting input terminal of said third operational amplifier is connected to the first connection terminal of said first resistor group through said fifth resistor and is meanwhile grounded through said sixth resistor;

the resistance values of said third resistor and said fourth resistor meet the following requirement: output voltage of said first LDO*resistance value of said fourth resistor/(resistance value of said third resistor+resistance value of said fourth resistor)=preset first current threshold*resistance value of the body coil+voltage difference between the drain D and source S of said MOSFET array;

the resistance values of said fifth resistor and said sixth resistor meet the following requirement: output voltage of said first LDO*resistance value of said sixth resistor/(resistance value of said fifth resistor+resistance value of said sixth resistor)=preset second current threshold*resistance value of the body coil+voltage difference between the drain D and the source S of said MOSFET array;

wherein, according to the output signals of said second operational amplifier and said third operational amplifier: if the current input to the body coil is not smaller than the preset second current threshold and not greater than the preset first current threshold, it is determined that the current input to the body coil is normal; if not, it is determined that the current input to the body coil is abnormal; the preset second current threshold is smaller than the preset first current threshold.

Said device further comprises: a second LDO and a second resistor group, wherein:
  the input terminal of said second LDO is connected to the input terminal of said first LDO, and the output terminal of said second LDO is connected to the first connection terminal of said second resistor group;
  the second connection terminal of said second resistor group is connected to the second connection terminal of said first resistor group;
  wherein said second LDO and said first LDO are exactly the same LDO;
  the structure of said second resistor group is exactly the same as that of said first resistor group.

Said first resistor group is formed by connecting two resistors with the same resistance in series, and the resistance of each resistor is 0.01 ohm±10%.

Said device further comprises: a fourth operational amplifier, a seventh resistor, an eighth resistor, and a ninth resistor, wherein:
  the first connection terminal of said seventh resistor is connected to the output terminal of said first LDO, and the second connection terminal of said seventh resistor is connected to the first connection terminal of said eighth resistor;
  the first connection terminal of said eighth resistor is connected to the output terminal of said second LDO;
  the non-inverting input terminal of said fourth operational amplifier is connected to the second connection terminal of said seventh resistor;
  said ninth resistor is connected between the inverting input terminal and the output terminal of said fourth operational amplifier;
  wherein the resistance value of said seventh resistor is equal to that of said eighth resistor;
  if the system detects that the difference between the output voltage of said fourth operational amplifier and that of said first LDO is within the preset range, it is determined that the output of said first LDO is balanced with that of said second LDO, and if not, it is determined that the output of said first LDO is unbalanced with that of said second LDO.

The resistance value of said seventh resistor is 10,000 ohm±20%.

The resistance value of said ninth resistor is not smaller than 1000 ohm and not greater than 5000 ohm.

Said device further comprises: a first logic circuit, a second logic circuit, and a MOSFET, wherein:
  said first logic circuit is connected in series between the output terminal of said first operational amplifier and the gate G of said MOSFET array, wherein the first input terminal of said first logic circuit is connected to the output terminal of said first operational amplifier;
  the second input terminal of said first logic circuit is connected to a tuning control module;
  the input terminal of said second logic circuit is connected to said tuning control module, and the output terminal is connected to the gate G of said MOSFET;
  the drain D of said MOSFET is connected to the source S of said MOSFET array, and the source S of said MOSFET receives the detuning voltage signal;
  when said tuning control module outputs a high level, said first logic circuit outputs the output voltage of said first operational amplifier to the gate G of said MOSFET array, and said MOSFET array is connected so that the source S of said MOSFET array outputs a constant preset current to the body coil of said MRI system; meanwhile, said second logic circuit is disconnected so that said MOSFET is disconnected;
  when said tuning control module outputs a low level, said first logic circuit outputs a low level to the gate G of said MOSFET array, said MOSFET array is disconnected and the source S of said MOSFET array has no current output; meanwhile, said second logic circuit is connected so that said MOSFET is connected and the detuning voltage signal is output to the body coil of said MRI system through said MOSFET.

A body coil tuning control device, characterized in that, said device comprises: a DC-DC converter, a first low dropout linear regulator (LDO), a first resistor group, a first operational amplifier, a negative feedback circuit, and a metal-oxide semiconductor field effect transistor (MOSFET) array, a second LDO, a second resistor group, a fourth operational amplifier, a seventh resistor, an eighth resistor, and a ninth resistor; said first resistor group comprises one resistor or multiple series resistors, the structure of said second resistor group is exactly the same as that of said first resistor group, said second LDO and said first LDO are exactly the same LDO, and the resistance value of said seventh resistor is equal to that of said eighth resistor, wherein:
  the input terminal of said DC-DC converter is connected to the DC power supply of a magnetic resonance (MRI) system, the output terminal to the input terminal of said first LDO, and said DC-DC converter is used to reduce the voltage of the input DC signal to the preset first voltage;
  the output terminal of said first LDO is connected to the first connection terminal of said first resistor group, and the output voltage of said first LDO is smaller than the first voltage;
  the input terminal of said second LDO is connected to the input terminal of said first LDO, and the output terminal of said second LDO is connected to the first connection terminal of said second resistor group;
  the second connection terminal of said second resistor group is connected to the second connection terminal of said first resistor group;
  the first connection terminal of said seventh resistor is connected to the output terminal of said first LDO, and the second connection terminal of said seventh resistor is connected to the first connection terminal of said eighth resistor;
  the first connection terminal of said eighth resistor is connected to the output terminal of said second LDO;
  the non-inverting input terminal of said fourth operational amplifier is connected to the second connection terminal of said seventh resistor;
  said ninth resistor is connected between the inverting input terminal and the output terminal of said fourth operational amplifier;
  the inverting input terminal of said first operational amplifier is connected to the output terminal of said fourth operational amplifier, and the non-inverting input terminal is connected to the second connection terminal of said first resistor group;
  the output terminal of said first operational amplifier is connected to the gate G of said MOSFET array;

said negative feedback circuit is connected between the output terminal and the inverting input terminal of said first operational amplifier;

the drain D of said MOSFET array is connected to the second connection terminal of said first resistor group, and the source S to the input terminal of the body coil of said MRI system;

wherein said negative feedback circuit meets the following requirement: after the output signal of said first operational amplifier is input to the gate G of said MOSFET array, the source S of said MOSFET array can output a constant preset current;

each MOSFET in said MOSFET array is connected in parallel, and the number of MOSFETs meets the following requirement: the power of each MOSFET is smaller than the preset power.

Said negative feedback circuit comprises: a first capacitor, a first resistor, and a second resistor, wherein:

the first connection terminal of said capacitor is connected to the inverting input terminal of said first operational amplifier, and the second connection terminal of said first capacitor is connected to the first connection terminal of said first resistor;

the second connection terminal of said resistor is connected to the output terminal of said first operational amplifier;

said second resistor is connected in parallel between the first connection terminal of said first capacitor and the second connection terminal of said first resistor;

the capacitance value of said first capacitor and the resistance values of said first resistor and said second resistor meet the following requirement: after being input to the gate G of said MOSFET array, the output signal of said first operational amplifier enables the source S of said MOSFET array to output a constant preset current.

Said device further comprises: a second operational amplifier, a third resistor, a fourth resistor, a third operational amplifier, a fifth resistor, and a sixth resistor, wherein:

the non-inverting input terminal of said second operational amplifier is connected to the output terminal of said fourth operational amplifier through said third resistor and is meanwhile grounded through said fourth resistor;

the inverting input terminal of said second operational amplifier is connected to the second connection terminal of said first resistor group;

the non-inverting input terminal of said third operational amplifier is connected to the second connection terminal of said first resistor group;

the inverting input terminal of said third operational amplifier is connected to the output terminal of said fourth operational amplifier through said fifth resistor and is meanwhile grounded through said sixth resistor;

the resistance values of said third resistor and said fourth resistor meet the following requirement: output voltage of said first LDO*resistance value of said fourth resistor/(resistance value of said third resistor+resistance value of said fourth resistor)=preset first current threshold*resistance value of the body coil+voltage difference between the drain D and source S of said MOSFET array;

the resistance values of said fifth resistor and said sixth resistor meet the following requirement: output voltage of said first LDO*resistance value of said sixth resistor/(resistance value of said fifth resistor+resistance value of said sixth resistor)=preset second current threshold*resistance value of the body coil+voltage difference between the drain D and the source S of said MOSFET array;

wherein, according to the output signals of said second operational amplifier and said third operational amplifier: if the current input to the body coil is not smaller than the preset second current threshold and not greater than the preset first current threshold, it is determined that the current input to the body coil is normal; if not, it is determined that the current input to the body coil is abnormal; the preset second current threshold is smaller than the preset first current threshold.

Said device further comprises: a first logic circuit, a second logic circuit, and a MOSFET, wherein:

said first logic circuit is connected in series between the output terminal of said first operational amplifier and the gate G of said MOSFET array, wherein the first input terminal of said first logic circuit is connected to the output terminal of said first operational amplifier;

the second input terminal of said first logic circuit is connected to a tuning control module;

the input terminal of said second logic circuit is connected to said tuning control module, and the output terminal is connected to the gate G of said MOSFET;

the drain D of said MOSFET is connected to the source S of said MOSFET array, and the source S of said MOSFET receives the detuning voltage signal;

when said tuning control module outputs a high level, said first logic circuit outputs the output voltage of said first operational amplifier to the gate G of said MOSFET array, and said MOSFET array is connected so that the source S of said MOSFET array outputs a constant preset current to the body coil of said MRI system; meanwhile, said second logic circuit is disconnected so that said MOSFET is disconnected;

when said tuning control module outputs a low level, said first logic circuit outputs a low level to the gate G of said MOSFET array, said MOSFET array is disconnected and the source S of said MOSFET array has no current output; meanwhile, said second logic circuit is connected so that said MOSFET is connected and the detuning voltage signal is output to the body coil of said MRI system through said MOSFET.

A magnetic resonance system comprises the body coil tuning control device as described in any of the above claims.

In the aspects of the present disclosure, the voltage of the DC power supply of said MRI system is reduced through said DC-DC converter and then reduced and stabilized through said LDO, and then the input signal of the gate G of said MOSFET array is adjusted through the operational amplifier with negative feedback circuit so that the source S of said MOSFET array outputs a constant current signal to the body coil. Because the power consumption of both said DC-DC converter and LDO is very low and the MOSFETs in the MOSFET array are connected in parallel, the power consumption of each MOSFET and that of the entire body coil tuning control device are both very low, and no additional forced air cooling or water-cooling device is needed, thus reducing the cost.

DESCRIPTION OF DRAWINGS

The preferred aspects according to the present disclosure will be further described below with reference to the attached drawings so that those with ordinary skill in the art can understand the aforesaid and other features and advantages of the present disclosure, wherein.

Wherein the reference numbers in the figures are as follows:

| Reference number | Description |
| --- | --- |
| 100 | DC-DC converter |
| 11 | First LDO |
| 12 | First resistor group |
| 13 | First operational amplifier |
| 14 | Negative feedback circuit |
| 141 | First capacitor |
| 142 | First resistor |
| 143 | Second resistor |
| 15 | MOSFET array |
| 16 | Second operational amplifier |
| 17 | Third resistor |
| 18 | Fourth resistor |
| 19 | Third operational amplifier |
| 20 | Fifth resistor |
| 21 | Sixth resistor |
| 22 | Second LDO |
| 23 | Second resistor group |
| 24 | Fourth operational amplifier |
| 25 | Seventh resistor |
| 26 | Eighth resistor |
| 27 | Ninth resistor |
| 28 | First logic circuit |
| 29 | Second logic circuit |
| 30 | MOSFET |
| 200 | Tuning control module |

DETAILED DESCRIPTION

In order to make the objective, technical solution, and advantages of the present disclosure clearer, the present disclosure is further detailed below with reference to the aspects.

Figure 1:
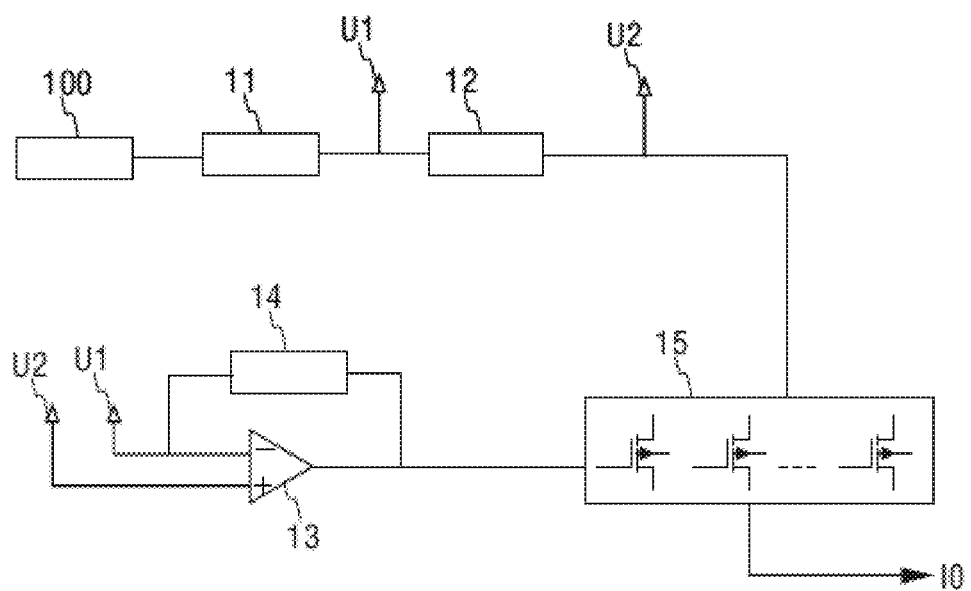
FIG. 1 shows the structural diagram of a body coil tuning control device that is provided by the first aspect of the present disclosure.

FIG. 1 shows a schematic diagram of the body coil tuning control device described in the first aspect of the present disclosure, wherein said device comprises: a direct current (DC)-DC converter (100), a first low dropout linear regulator (LDO) 11, a first resistor group 12, a first operational amplifier 13, a negative feedback circuit 14, and a metal-oxide semiconductor field effect transistor (MOSFET) array 15, and said first resistor group 12 comprises one resistor or multiple series resistors, wherein:

the input terminal of said DC-DC converter 100 is connected to the DC power supply (usually 24 V) of an MRI system, the output terminal to the input terminal of said first LDO 11, and said DC-DC converter 100 is used to reduce the voltage (usually 24 V) of the input DC signal to the preset first voltage (e.g., 5.5 V);

the conversion efficiency of DC-DC converter 100 is greater than 90%, e.g., if the input voltage is 24 V and the current is 4.75 A, the total input power is 24*4.75=114 W, and the power converted to heat is less than 114*(100-90)%=11.4 W.

the output terminal of said first LDO 11 is connected to the first connection terminal of said first resistor group 12, and the output voltage (e.g., 4.5 V) of said first LDO 11 is smaller than the input first voltage (e.g., 5.5 V);

the power of said first LDO 11=(input voltage−output voltage)*current, which indicates that, when the input voltage is 5.5 V, the output voltage is 4.5 V, and the current is 5 A, the power is only (5.5−4.5)*5=5 W.

The inverting input terminal of said first operational amplifier 13 is connected to the first connection terminal (i.e., U1 in FIG. 1) of said first resistor group 12, and the non-inverting input terminal to the second connection terminal (i.e., U2 in FIG. 1) of said first resistor group 12;

the output terminal of said first operational amplifier 13 is connected to the gate G of said MOSFET array 15;

said negative feedback circuit 14 is connected between the output terminal and the inverting input terminal of said first operational amplifier 13;

the drain D of said MOSFET array 15 is connected to the second connection terminal of said first resistor group 12, and the source S to the input terminal of the body coil of said MRI system;

wherein said negative feedback circuit 14 meets the following requirement: after the output signal of said first operational amplifier 13 is input to the gate G of said MOSFET array 15, the source S of said MOSFET array 15 can output a constant preset current (e.g., 4.75 A);

each MOSFET in said MOSFET array 15 is connected in parallel, and the number of MOSFETs meets the following requirement: the power of each MOSFET is smaller than the preset power. Each MOSFET in said MOSFET array 15 can be a P-MOSFET.

In the above device, said DC-DC converter 100 reduces the voltage of the input DC signal to the preset first voltage, said first LDO 11 reduces and stabilizes the input DC voltage to the second voltage output, and said first operational amplifier 13 amplifies the voltage signal input from the non-inverting input terminal and the voltage signal input from the inverting input terminal, wherein said negative feedback circuit 14 adjusts the voltage signal input from the inverting input terminal according to the output signal so that, after the output signal of said first operational amplifier 13 is input to the gate G of said MOSFET array 15, the source S of said MOSFET array 15 can output a constant preset current 10 to the body coil of said MRI system.

It can be seen that, in the above aspects, the voltage of the DC power supply of said MRI system is reduced through said DC-DC converter and then reduced and stabilized through said LDO, and then the input signal of the gate G of said MOSFET array is adjusted through the operational amplifier with negative feedback circuit so that the source S of said MOSFET array outputs a constant current signal to the body coil. Because the power consumption of both said DC-DC converter and LDO is very low and the MOSFETs in the MOSFET array are connected in parallel, the power consumption of each MOSFET and that of the entire body coil tuning control device are both very low, and no additional forced air cooling or water-cooling device is needed, thus reducing the cost.

Figure 2:
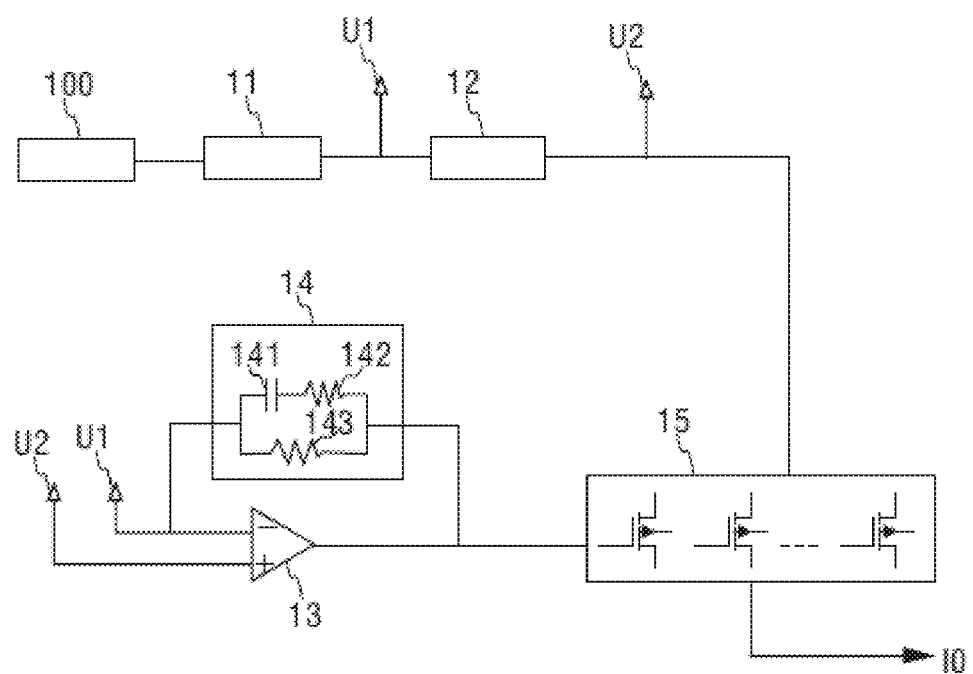
FIG. 2 shows the structural diagram of a body coil tuning control device that is provided by the second aspect of the present disclosure.

FIG. 2 shows a schematic diagram of the body coil tuning control device provided by the second aspect of the present disclosure, which discloses an implementation method of said negative feedback circuit 14 in the first aspect, and the remaining parts are the same as those of the first aspect. In the second aspect, said negative feedback circuit 14 mainly comprises: a first capacitor 141, a first resistor 142, and a second resistor 143, wherein: the first connection terminal of said capacitor 141 is connected to the inverting input terminal of said first operational amplifier 13, and the second connection terminal of said first capacitor 141 to the first connection terminal of said first resistor 142;

the second connection terminal of said resistor 142 is connected to the output terminal of said first operational amplifier 13;

said second resistor 143 is connected in parallel between the first connection terminal of said first capacitor 141 and the second connection terminal of said first resistor 142.

Wherein the capacitance value of said first capacitor 141 and the resistance values of said first resistor 142 and said second resistor 143 meet the following requirement: after being input to the gate G of said MOSFET array 15, the output signal of said first operational amplifier 13 enables the source S of said MOSFET array 15 to output a constant preset current (e.g., 4.75 A).

Figure 3:
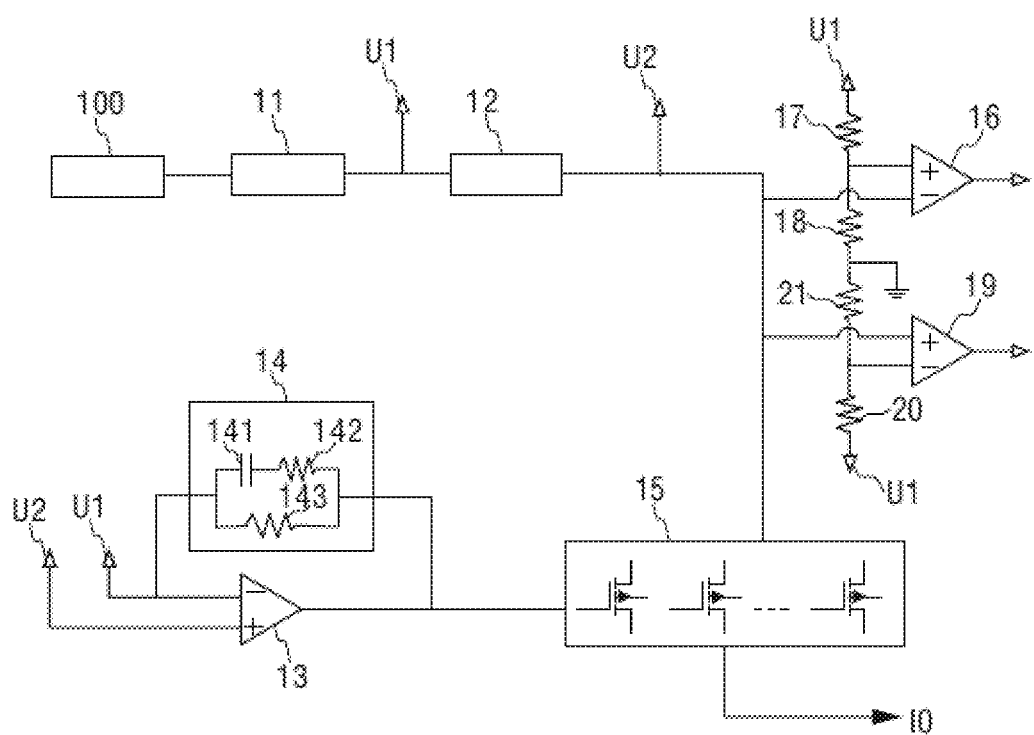
FIG. 3 shows the structural diagram of a body coil tuning control device that is provided by the third aspect of the present disclosure.

FIG. 3 shows a structural diagram of the body coil tuning control device provided by the third aspect of the present disclosure, which, compared with the first aspect and the second aspect, adds: a second operational amplifier 16, a third resistor 17, a fourth resistor 18, a third operational amplifier 19, a fifth resistor 20, and a sixth resistor 21, wherein:

the non-inverting input terminal of said second operational amplifier 16 is connected to the first connection terminal of said first resistor group 12 through said third resistor 17, and grounded at the same time through said fourth resistor 18;

the inverting input terminal of said second operational amplifier 16 is connected to the second connection terminal of said first resistor group 12;

the non-inverting input terminal of said third operational amplifier 19 is connected to the second connection terminal of said first resistor group 12;

the inverting input terminal of said third operational amplifier 19 is connected to the first connection terminal of said first resistor group 12 through said fifth resistor 20, and grounded at the same time through said sixth resistor 21;

the resistance values of said third resistor 17 and said fourth resistor 18 meet the following requirement: output voltage of said first LDO 11*resistance value of said fourth resistor 18/(resistance value of said third resistor 17+resistance value of said fourth resistor 18)=preset first current threshold*resistance value of body coil+voltage difference between drain D and source S of said MOSFET array 15;

the resistance values of said fifth resistor 20 and said sixth resistor 21 meet the following requirement: output voltage of said first LDO 11*resistance value of said sixth resistor 21/(resistance value of said fifth resistor 20+resistance value of said sixth resistor 21)=preset second current threshold*resistance value of the body coil+voltage difference between the drain D and the source S of said MOSFET array 15.

Said second operational amplifier 16 and said third operational amplifier 19 are essentially voltage comparators.

When the non-inverting input terminal voltage of said second operational amplifier 16 is higher than the inverting input terminal voltage, the output end of said second operational amplifier 16 outputs a high level, and it indicates that the current output from the source S of said MOSFET array 15 to the body coil is greater than said preset first current threshold.

When the non-inverting input terminal voltage of said third operational amplifier 19 is higher than the inverting input terminal voltage, the output end of said third operational amplifier 19 outputs a high level, and it indicates that the current output from the source S of said MOSFET array 15 to the body coil is smaller than said preset second current threshold.

Thus, the output levels from the output ends of said second operational amplifier 16 and said third operational amplifier 19 can be used to determine the range in which the current output from the source S of said current MOSFET array 15 to the body coil is located. For example:

If said first current threshold (e.g., 5.5 V) is greater than said second current threshold (e.g., 4.5 V), the current is determined to be in one of the following three ranges: Range 1: smaller than said second current threshold; range 2: not smaller than said second current threshold and not greater than said first current threshold; range 3: greater than said first current threshold; if the current is in range 2, the current output to the body coil is normal; otherwise, the current output to the body coil is abnormal. Here, said first current threshold is greater than the above constant preset current (e.g., 4.75 A), said second current threshold is smaller than the above constant preset current (e.g., 4.75 A), and the specific values of said first current threshold and said second current threshold are set based on experience.

The above aspect can be used to monitor whether the current output to the body coil is in the normal range.

In the practical application, due to the limitation by the performance of LDO, using only one LDO may not reach the current size required by the body coil of the MRI system, when LDOs need to be added in the device.

Figure 4:
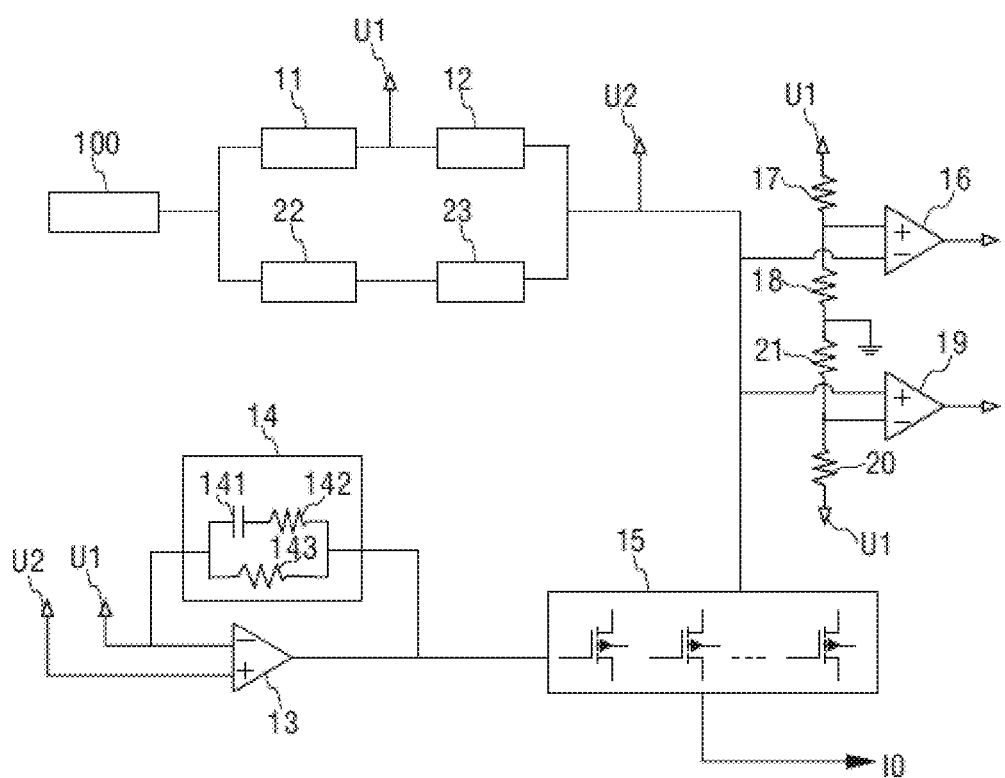
FIG. 4 shows the structural diagram of a body coil tuning control device that is provided by the fourth aspect of the present disclosure.

FIG. 4 shows a structural diagram of the body coil tuning control device provided by the fourth aspect of the present disclosure, which, compared with the first aspect, the second aspect, and the third aspect, adds: a second LDO 22 and a second resistor group 23, wherein:

the input terminal of said second LDO 22 is connected to the input terminal of said first LDO 11, and the output terminal of said second LDO 22 is connected to the first connection terminal of said second resistor group 23;

the second connection terminal of said second resistor group 23 is connected to the second connection terminal of said first resistor group 12.

Here, said second LDO 22 and said first LDO 11 are exactly the same LDO;

The structure of said second resistor group 23 is exactly the same as that of said first resistor group 12, that is, the number of resistors contained in said second resistor group 23, the resistance value of each resistor, and the inter-resistor connection mode are exactly the same as those of said first resistor group 12.

In the above aspect, said two LDOs are connected in parallel to increase the current output to the body coil of said MRI system so that the current output to the body coil can meet the operating requirements of the body coil.

In the practical application, said first resistor group 12 and said second resistor group 23 can be formed respectively using two resistors with the same resistance value connected in series, and the resistance value of each resistor can be 0.01Ω (ohm)±10%, which aims to reduce power consumption.

Figure 5:
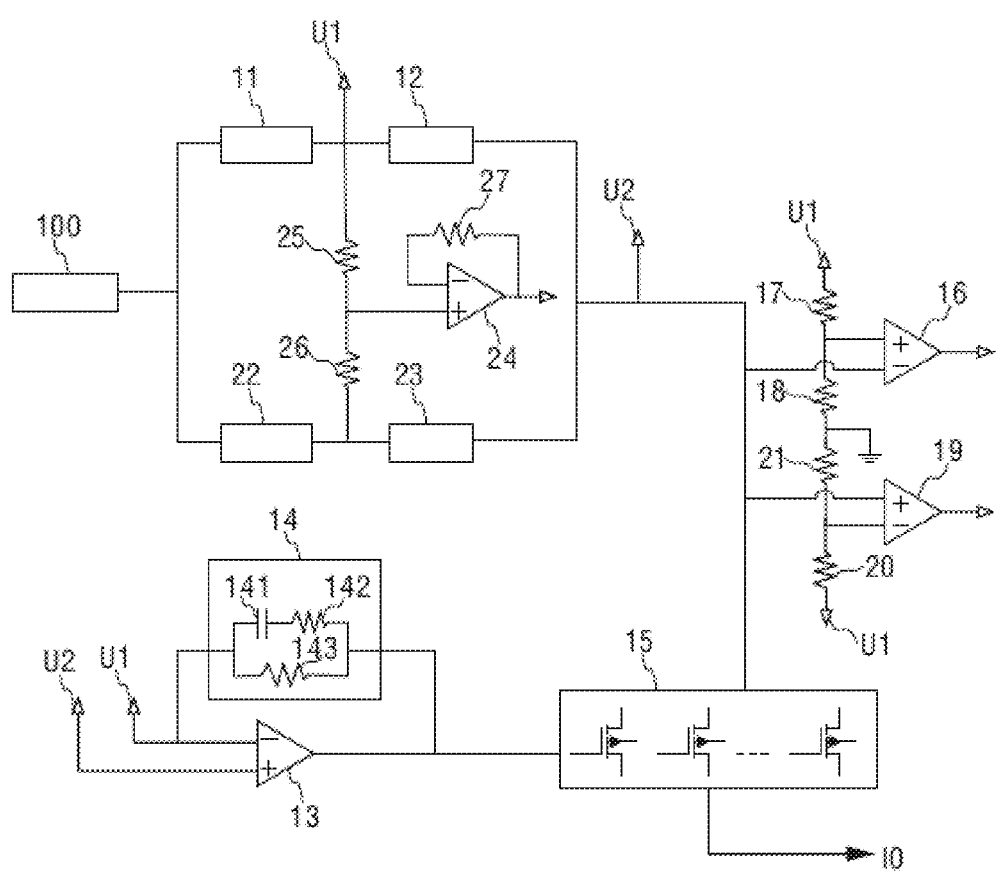
FIG. 5 shows the structural diagram of a body coil tuning control device that is provided by the fifth aspect of the present disclosure.

Considering that LDO may become abnormal due to various reasons in the practical application, the present disclosure offers the following solution so as to check the operating status of LDO in a timely manner:

FIG. 5 shows a structural diagram of the body coil tuning control device provided by the fifth aspect of the present disclosure, which, compared with the fourth aspect, adds: a fourth operational amplifier 24, a seventh resistor 25, an eighth resistor 26, and a ninth resistor 27, wherein:

the first connection terminal of said seventh resistor 25 is connected to the output terminal of said first LDO 11, and the second connection terminal of said seventh resistor 25 is connected to the first connection terminal of said eighth resistor 26;

the first connection terminal of said eighth resistor 26 is connected to the output terminal of said second LDO 22;

the non-inverting input terminal of said fourth operational amplifier 24 is connected to the second connection terminal of said seventh resistor 25;

said ninth resistor 27 is connected between the inverting input terminal and the output terminal of said fourth operational amplifier 24;

if the system detects that the difference between the output voltage of said fourth operational amplifier 24 and that of said first LDO 11 is within the preset range, it is determined that the output of said first LDO 11 is balanced with that of said second LDO 22, and if not, it is determined that the output of said first LDO 11 is unbalanced with that of said second LDO 22. For example, the preset range can be ±10%*normal output voltage of said first LDO 11.

In the practical application, the resistance values of said seventh resistor 25 and said eighth resistor 26 can be 10 KΩ (kilo-ohm)±20%, and the resistance value of said ninth resistor 27 can be not smaller than 1 KΩ and not greater than 5 KΩ.

Figure 6:
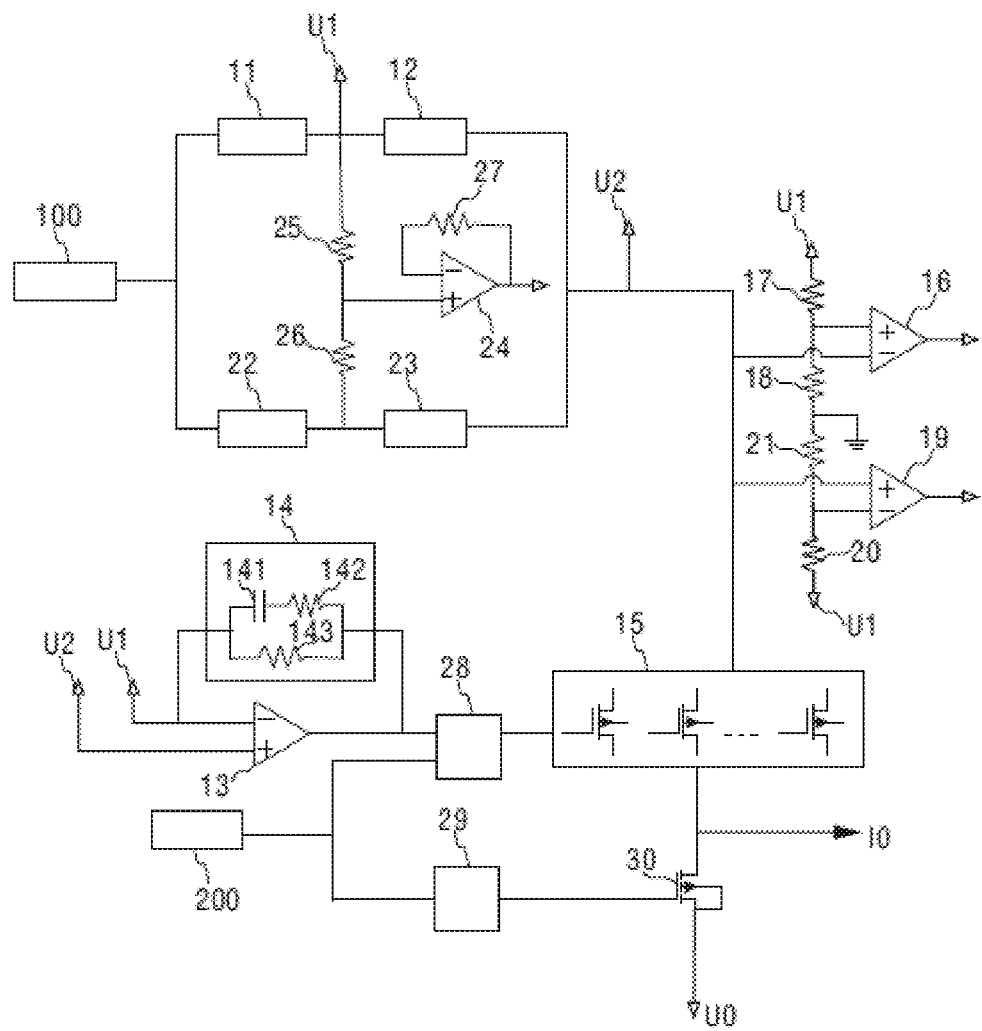
FIG. 6 shows the structural diagram of a body coil tuning control device that is provided by the sixth aspect of the present disclosure.

FIG. 6 shows a structural diagram of the body coil tuning control device provided by the sixth aspect of the present disclosure, which, compared with the first aspect to the fifth aspect, adds: a first logic circuit 28, a second logic circuit 29, and a MOSFET 30, wherein:

said first logic circuit 28 is connected in series between the output terminal of said first operational amplifier 13 and the gate G of said MOSFET array 15, wherein the first input terminal of said first logic circuit 28 is connected to the output terminal of said first operational amplifier 13;

the second input terminal of said first logic circuit 28 is connected to said tuning control module 200;

the input terminal of said second logic circuit 29 is connected to said tuning control module 200, and the output terminal is connected to the gate G of said MOSFET 30;

the drain D of said MOSFET 30 is connected to the source S of said MOSFET array 15, and the source S of said MOSFET 30 receives the detuning voltage signal U0 (e.g., −12V). Said MOSFET 30 can be a P-MOSFET.

When said tuning control module 200 outputs a high level, said first logic circuit 28 outputs the output voltage of said first operational amplifier 13 to the gate G of said MOSFET array 15, and said MOSFET array 15 is connected so that the source S of said MOSFET array 15 outputs a constant preset current to the body coil of said MRI system; meanwhile, said second logic circuit 29 is disconnected so that said MOSFET 30 is disconnected;

when said tuning control module 200 outputs a low level, said first logic circuit 28 outputs a low level to the gate G of said MOSFET array 15, and said MOSFET array 15 is disconnected and the source S of said MOSFET array 15 has no current output; meanwhile, said second logic circuit 29 is connected so that said MOSFET 30 is connected and the detuning voltage signal U0 is output to the body coil of said MRI system through said MOSFET 30.

Figure 7:
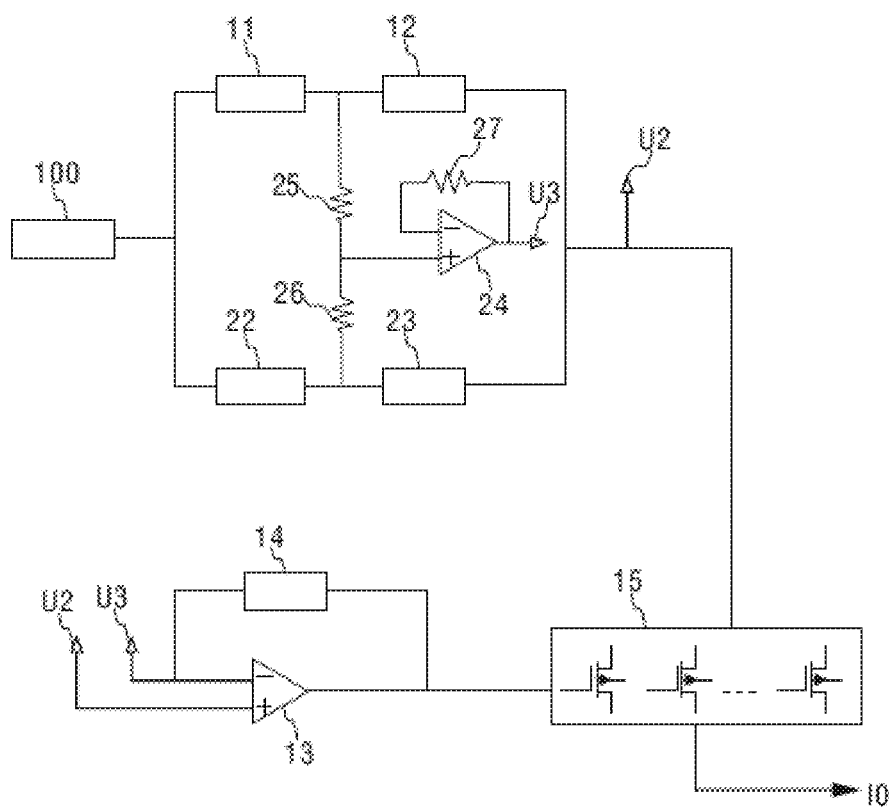
FIG. 7 shows the structural diagram of a body coil tuning control device that is provided by the seventh aspect of the present disclosure.

FIG. 7 shows a structural diagram of the body coil tuning control device provided by the seventh aspect of the present disclosure, which comprises: a DC-DC converter 100, a first LDO 11, a first resistance group 12, a first operational amplifier 13, a negative feedback circuit 14, a MOSFET array 15, a second LDO 22, a second resistor group 23, a fourth operational amplifier 24, a seventh resistor 25, an eighth resistor 26, and a ninth resistor 27, wherein said first resistance group 12 comprises one resistor or multiple series resistors, the structure of said second resistor group 23 is exactly the same as that of said first resistor group 12, said second LDO 22 and first LDO 11 are exactly the same LDO, and the resistance value of said seventh resistor 25 is equal to that of said eighth resistance 26, wherein:

the input terminal of said DC-DC converter 100 is connected to the DC power supply (usually 24 V) of an MRI system, the output terminal to the input terminal of said first LDO 11, and said DC-DC converter 100 is used to reduce the voltage (usually 24 V) of the input DC signal to the preset first voltage (e.g., 5.5 V);

the output terminal of said first LDO 11 is connected to the first connection terminal of said first resistor group 12, and the output voltage (e.g., 4.5 V) of said first LDO 11 is smaller than said first voltage;

the input terminal of said second LDO 22 is connected to the input terminal of said first LDO 11, and the output terminal of said second LDO 22 is connected to the first connection terminal of said second resistor group 23;

the second connection terminal of said second resistor group 23 is connected to the second connection terminal of said first resistor group 12;

the first connection terminal of said seventh resistor 25 is connected to the output terminal of said first LDO 11, and the second connection terminal of said seventh resistor 25 is connected to the first connection terminal of said eighth resistor 26;

the first connection terminal of said eighth resistor 26 is connected to the output terminal of said second LDO 22;

the non-inverting input terminal of said fourth operational amplifier 24 is connected to the second connection terminal of said seventh resistor 25;

said ninth resistor 27 is connected between the inverting input terminal and the output terminal of said fourth operational amplifier 24;

The inverting input terminal of said first operational amplifier 13 is connected to the input terminal (i.e., U3 in FIG. 7) of said fourth operational amplifier 24, and the non-inverting input terminal to the second connection terminal (i.e., U2 in FIG. 7) of said first resistor group 12;

the output terminal of said first operational amplifier 13 is connected to the gate G of said MOSFET array 15;

said negative feedback circuit 14 is connected between the output terminal and the inverting input terminal of said first operational amplifier 13;

the drain D of said MOSFET array 15 is connected to the second connection terminal of said first resistor group 12, and the source S to the input terminal of the body coil of said MRI system;

wherein said negative feedback circuit 14 meets the following requirement: after the output signal of said first operational amplifier 13 is input to the gate G of said MOSFET array 15, the source S of said MOSFET array 15 can output a constant preset current (e.g., 4.75 A);

each MOSFET in said MOSFET array 15 is connected in parallel, and the number of MOSFETs meets the following requirement: the power of each MOSFET is smaller than the preset power. Each MOSFET in said MOSFET array 15 can be a P-MOSFET.

In practical application, said first resistor group 12 and said second resistor group 23 can be formed respectively using two resistors with the same resistance value connected in series, and the resistance value of each resistor can be 0.01Ω (ohm)±10%, which aims to reduce power consumption.

In the practical application, the resistance values of said seventh resistor 25 and said eighth resistor 26 can be 10 KΩ (kilo-ohm)±20%, and the resistance value of said ninth resistor 27 can be not smaller than 1 KΩ and not greater than 5 KΩ.

In the above device, said DC-DC converter 100 reduces the voltage of the input DC signal to a preset first voltage, said first LDO 11 and second LDO 22 reduce and stabilize the input DC voltage to a second voltage output, and said first operational amplifier 13 amplifies the voltage signal input from the non-inverting input terminal and the voltage signal input from the inverting input terminal, wherein said negative feedback circuit 14 adjusts the voltage signal input from the inverting input terminal according to the output signal so that, after the output signal of said first operational amplifier 13 is input to the gate G of said MOSFET array 15, the source S of said MOSFET array 15 can output a constant preset current 10 to the body coil of said MRI system.

It can be seen that, in the above aspects, the voltage of the DC power supply of said MRI system is reduced through said DC-DC converter and then reduced and stabilized through said LDO, and then the input signal of the gate G of said MOSFET array is adjusted through the operational amplifier with negative feedback circuit so that the source S of said MOSFET array outputs a constant current signal to the body coil. Because the power consumption of both said DC-DC converter and LDO is very low and the MOSFETs in the MOSFET array are connected in parallel, the power consumption of each MOSFET and that of the entire body coil tuning control device are both very low, and no additional forced air cooling or water-cooling device is needed, thus reducing the cost.

Figure 8:
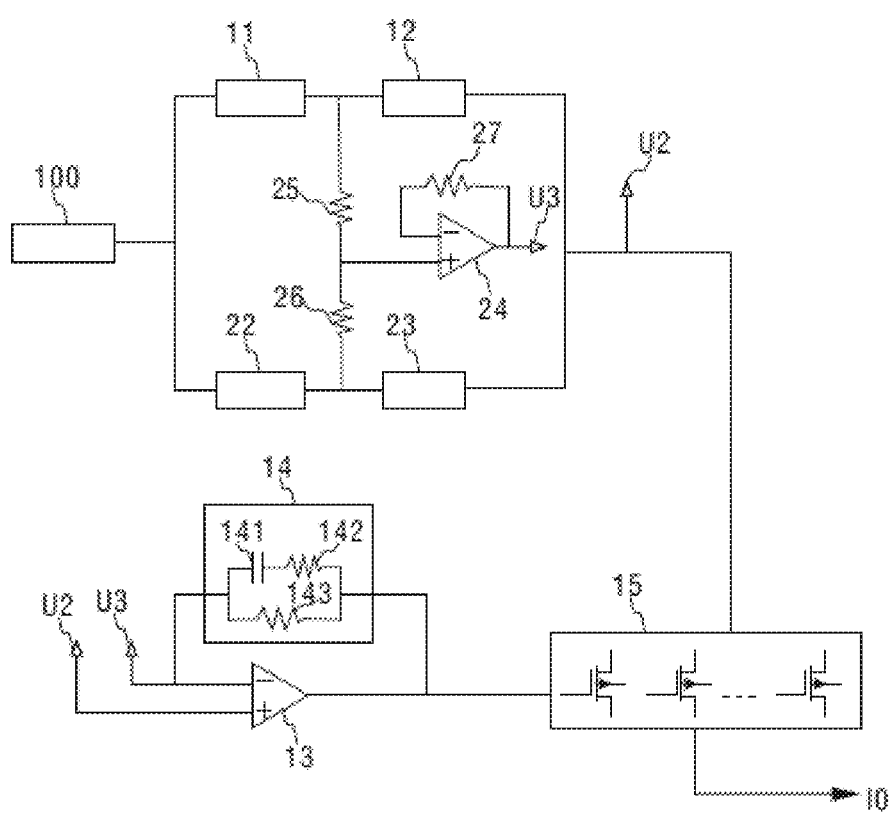
FIG. 8 shows the structural diagram of a body coil tuning control device that is provided by the eighth aspect of the present disclosure.

FIG. 8 shows a structural diagram of the body coil tuning control device provided by the eighth aspect of the present disclosure, which discloses an implementation method of said negative feedback circuit 14 in the seventh aspect, and the remaining parts are the same as those of the first aspect. In the second aspect, said negative feedback circuit 14 mainly comprises: a first capacitor 141, a first resistor 142, and a second resistor 143, wherein:

the first connection terminal of said capacitor 141 is connected to the inverting input terminal of said first operational amplifier 13, and the second connection terminal of said first capacitor 141 to the first connection terminal of said first resistor 142;

the second connection terminal of said resistor 142 is connected to the output terminal of said first operational amplifier 13;

said second resistor 143 is connected in parallel between the first connection terminal of said first capacitor 141 and the second connection terminal of said first resistor 142.

The capacitance value of said first capacitor 141 and the resistance values of said first resistor 142 and said second resistor 143 meet the following requirement: after being input to the gate G of said MOSFET array 15, the output signal of said first operational amplifier 13 enables the source S of said MOSFET array 15 to output a constant preset current (e.g., 4.75 A).

Figure 9:
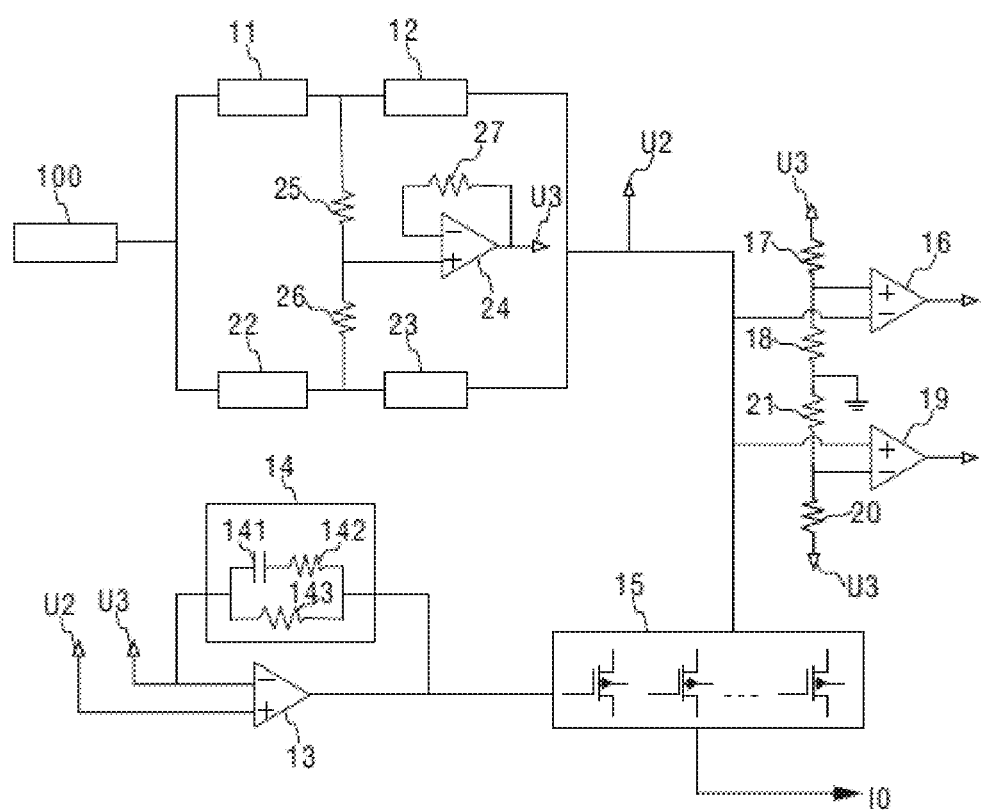
FIG. 9 shows the structural diagram of a body coil tuning control device that is provided by the ninth aspect of the present disclosure.

FIG. 9 shows a structural diagram of the body coil tuning control device provided by the ninth aspect of the present disclosure, which, compared with the seventh aspect and the eighth aspect, adds: a second operational amplifier 16, a third resistor 17, a fourth resistor 18, a third operational amplifier 19, a fifth resistor 20, and a sixth resistor 21, wherein:

the non-inverting input terminal of said second operational amplifier 16 is connected to the output terminal of said fourth operational amplifier 24 through said third resistor 17 and is meanwhile grounded through said fourth resistor 18;

the inverting input terminal of said second operational amplifier 16 is connected to the second connection terminal of said first resistor group 12;

the non-inverting input terminal of said third operational amplifier 19 is connected to the second connection terminal of said first resistor group 12;

the inverting input terminal of said third operational amplifier 19 is connected to the output terminal of said fourth operational amplifier 24 through said fifth resistor 20 and is meanwhile grounded through said sixth resistor 21;

the resistance values of said third resistor 17 and said fourth resistor 18 meet the following requirement: output voltage of said first LDO 11*resistance value of said fourth resistor 18/(resistance value of said third resistor 17+resistance value of said fourth resistor 18)=preset first current threshold*resistance value of body coil+voltage difference between drain D and source S of said MOSFET array 15;

the resistance values of said fifth resistor 20 and said sixth resistor 21 meet the following requirement: output voltage of said first LDO 11*resistance value of said sixth resistor 21/(resistance value of said fifth resistor 20+resistance value of said sixth resistor 21)=preset second current threshold*resistance value of the body coil+voltage difference between the drain D and the source S of said MOSFET array 15;

wherein, according to the output signals of said second operational amplifier 16 and said third operational amplifier 19: if the current input to the body coil is not smaller than the preset second current threshold and not greater than the preset first current threshold, it is determined that the current input to the body coil is normal; if not, it is determined that the current input to the body coil is abnormal; the preset second current threshold is smaller than the preset first current threshold.

Figure 10:
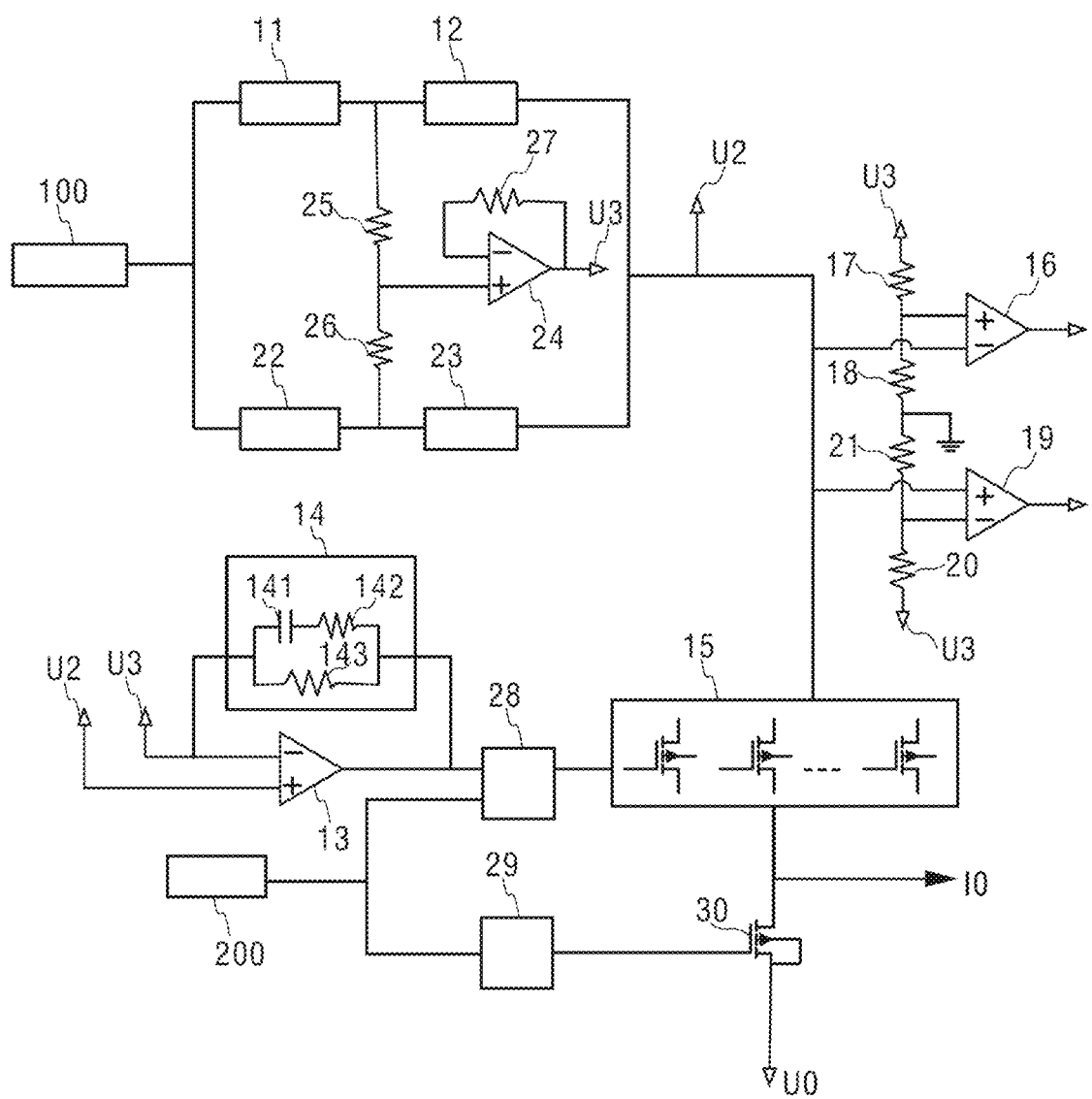
FIG. 10 shows the structural diagram of a body coil tuning control device that is provided by the tenth aspect of the present disclosure.

FIG. 10 shows a structural diagram of the body coil tuning control device provided by the tenth aspect of the present disclosure, which, compared with the seventh aspect, the eighth aspect, and the ninth aspect, adds: a first logic circuit 28, a second logic circuit 29, and a MOSFET 30, wherein:

said first logic circuit 28 is connected in series between the output terminal of said first operational amplifier 13 and the gate G of said MOSFET array 15, wherein the first input terminal of said first logic circuit 28 is connected to the output terminal of said first operational amplifier 13;

the second input terminal of said first logic circuit 28 is connected to said tuning control module 200;

the input terminal of said second logic circuit 29 is connected to said tuning control module 200, and the output terminal is connected to the gate G of said MOSFET 30;

the drain D of said MOSFET 30 is connected to the source S of said MOSFET array 15, and the source S of said MOSFET 30 receives the detuning voltage signal;

when said tuning control module 200 outputs a high level, said first logic circuit 28 outputs the output voltage of said first operational amplifier 13 to the gate G of said MOSFET array 15, and said MOSFET array 15 is connected so that the source S of said MOSFET array 15 outputs a constant preset current to the body coil of said MRI system; meanwhile, said second logic circuit 29 is disconnected so that said MOSFET 30 is disconnected;

when said tuning control module 200 outputs a low level, said first logic circuit 28 outputs a low level to the gate G of said MOSFET array 15, and said MOSFET array 15 is disconnected and the source S of said MOSFET array 15 has no current output; meanwhile, said second logic circuit 29 is connected so that said MOSFET 30 is connected and the detuning voltage signal is output to the body coil of said MRI system through said MOSFET 30.

Comparing the seventh to tenth aspects with the fifth to sixth aspects can find the following differences:

In the seventh to tenth aspects, it is the output terminal (i.e., U3 in FIGS. 7 to 10) of said fourth operational amplifier 24 that is connected to the inverting input terminal of said first operational amplifier 13, to the non-inverting input terminal of said second operational amplifier 16 through said third resistor 17, and to the inverting input terminal of said third operational amplifier 19 through said fifth resistor 20;

In the fifth to sixth aspects, it is the first connection terminal (i.e., U1 in FIGS. 5 to 6) of said first resistor group 12 that is connected to the inverting input terminal of said first operational amplifier 13, to the non-inverting input terminal of said second operational amplifier 16 through said third resistor 17, and to the inverting input terminal of said third operational amplifier 19 through said fifth resistor 20.

The aspects of the present disclosure further provide an MR system, which comprises the body coil tuning control device as described in any of the above aspects.

The aspects of the present disclosure show the following beneficial technical effects:

I. Low power consumption

The voltage of the DC power supply of said MRI system is reduced through said DC-DC converter and then reduced and stabilized through said LDO, and then the input signal of the gate G of said MOSFET array is adjusted through the operational amplifier with negative feedback circuit so that the source S of said MOSFET array outputs a constant current signal to the body coil. Because the power consumption of both said DC-DC converter and LDO is very low and the MOSFETs in the MOSFET array are connected in parallel, the power consumption of each MOSFET and that of the entire body coil tuning control device are both very low.

For example, if the input voltage of LDO is 5.5 V and the output voltage is 4.5 V, the voltage drop is 1 V; if the current is 4.75 A, the power consumption is 4.75 W, which is very low.

II. Low cost

No additional forced air cooling or water-cooling device is required, so the cost is reduced.

For example, if said MOSFET array 15 comprises 12 P-MOSFETs, the maximum overall power consumption of said MOSFET array 15 is 10 W, the power consumption of each P-MOSFET is only about 1.2 W, the maximum temperature caused is only about 60° C., and no water cooling or forced air cooling is required at room temperature.

III. Fuses no longer required

Because LDO has the characteristic of closing when the current exceeds the limit, no fuses are required.

IV. Shorter response time

The response time of MOSFET is shorter than that of the existing BJT transistor.

V. Providing the current monitoring function, featuring higher reliability and more convenient maintenance VI. When the body coil adopts a multi-channel design, the body coil tuning control device provided by the aspects of the present disclosure can be used to supply current to each channel to improve the current supply capacity.

The above describes only some preferred aspects of the present disclosure and is not used to limit the protection scope of the present disclosure. Any modification, equivalent replacement, and improvement without departure from the spirit and principle of the present disclosure shall fall within the scope of protection of the present disclosure.

The invention claimed is:

1. A body coil tuning control device, comprising:
a DC-DC converter, a first low dropout linear regulator (LDO), a first resistor group having one resistor or multiple series resistors, a first operational amplifier, a negative feedback circuit, and a metal-oxide semiconductor field effect transistor (MOSFET) array, wherein:
said DC-DC converter has an input terminal connected to a DC power supply of a magnetic resonance imaging (MRI) system and an output terminal connected to an input terminal of said first LDO, and said DC-DC converter is configured to reduce a voltage of an input DC signal to a preset first voltage;

said first LDO has an output terminal connected to a first connection terminal of said first resistor group, and an output voltage of said first LDO is smaller than the preset first voltage;

said first operational amplifier has an inverting input terminal connected to the first connection terminal of said first resistor group and a non-inverting input terminal connected to a second connection terminal of said first resistor group;

said first operational amplifier has an output terminal connected to a gate of said MOSFET array;

said negative feedback circuit is connected between the output terminal of the operational amplifier and the inverting input terminal of said first operational amplifier;

said MOSFET array has a drain connected to the second connection terminal of said first resistor group, and a source connected to the input terminal of the body coil of said MRI system;

said negative feedback circuit meets the following requirement: after an output signal of said first operational amplifier is input to the gate of said MOSFET array, the source of said MOSFET array outputs a constant preset current; and each MOSFET in said MOSFET array is connected in parallel, and a number of MOSFETs meets a requirement that a power of each MOSFET is smaller than a preset power.

2. A body coil tuning control device, comprising: a DC-DC converter, a first low dropout linear regulator (LDO), a first resistor group, a first operational amplifier, a negative feedback circuit, a metal-oxide semiconductor field effect transistor (MOSFET) array, a second LDO, a second resistor group, a fourth operational amplifier, a seventh resistor, an eighth resistor, a ninth resistor, said first resistor group including one resistor or multiple series resistors, a structure of said second resistor group being the same as that of said first resistor group, said second LDO and said first LDO being the same LDO, and the resistance value of said seventh resistor being equal to that of said eighth resistor, wherein:

said DC-DC converter has an input terminal connected to a DC power supply of a magnetic resonance (MRI) system and an output terminal connected to the input terminal of said first LDO, and said DC-DC converter is used to reduce a voltage of the input DC signal to a preset first voltage;

the output terminal of said first LDO is connected to the first connection terminal of said first resistor group, and an output voltage of said first LDO is smaller than the preset first voltage;

the input terminal of said second LDO is connected to the input terminal of said first LDO, and the output terminal of said second LDO is connected to the first connection terminal of said second resistor group;

the second connection terminal of said second resistor group is connected to the second connection terminal of said first resistor group;

the first connection terminal of said seventh resistor is connected to the output terminal of said first LDO, and the second connection terminal of said seventh resistor is connected to the first connection terminal of said eighth resistor;

the first connection terminal of said eighth resistor is connected to the output terminal of said second LDO;

a non-inverting input terminal of said fourth operational amplifier is connected to the second connection terminal of said seventh resistor;

said ninth resistor is connected between an inverting input terminal and the output terminal of said fourth operational amplifier;

said first operational amplifier has an inverting input terminal connected to the output terminal of said fourth operational amplifier and a non-inverting input terminal connected to the second connection terminal of said first resistor group;

the output terminal of said first operational amplifier is connected to a gate of said MOSFET array;

said negative feedback circuit is connected between the output terminal and the inverting input terminal of said first operational amplifier;

a drain of said MOSFET array is connected to the second connection terminal of said first resistor group, and a source to the input terminal of the body coil of said MRI system;

said negative feedback circuit meets a requirement that after the output signal of said first operational amplifier is input to the gate of said MOSFET array, the source of said MOSFET array can output a constant preset current; and each MOSFET in said MOSFET array is connected in parallel, and a number of MOSFETs meets a requirement that a power of each MOSFET is smaller than a preset power.

3. The device as claimed in claim 1, wherein said negative feedback circuit comprises: a first capacitor, a first resistor, and a second resistor, wherein:

the first connection terminal of said capacitor is connected to the inverting input terminal of said first operational amplifier, and the second connection terminal of said first capacitor to the first connection terminal of said first resistor;

the second connection terminal of said first resistor is connected to the output terminal of said first operational amplifier;

said second resistor is connected in parallel between the first connection terminal of said first capacitor and the second connection terminal of said first resistor; and the capacitance value of said first capacitor and the resistance values of said first resistor and said second resistor meet a requirement that after being input to the gate of said MOSFET array, the output signal of said first operational amplifier enables the source of said MOSFET array to output a constant preset current.

4. The device as claimed in claim 1, further comprising: a second operational amplifier, a third resistor, a fourth resistor, a third operational amplifier, a fifth resistor, and a sixth resistor, wherein:

the non-inverting input terminal of said second operational amplifier is connected to the first connection terminal of said first resistor group through said third resistor and is meanwhile grounded through said fourth resistor;

the inverting input terminal of said second operational amplifier is connected to the second connection terminal of said first resistor group;

said third operational amplifier has its non-inverting input terminal connected to the second connection terminal of said first resistor group;

the inverting input terminal of said third operational amplifier is connected to the first connection terminal of said first resistor group through said fifth resistor and is meanwhile grounded through said sixth resistor;

the resistance values of said third resistor and said fourth resistor meet a requirement that an output voltage of said first LDO*resistance value of said fourth resistor/(resistance value of said third resistor+resistance value of said fourth resistor)=preset first current threshold*resistance value of body coil+voltage difference between drain and source of said MOSFET array;

the resistance values of said fifth resistor and said sixth resistor meet a requirement that an output voltage of said first LDO*resistance value of said sixth resistor/(resistance value of said fifth resistor+resistance value of said sixth resistor)=preset second current threshold*resistance value of the body coil+voltage difference between the drain and the source of said MOSFET array; and according to the output signals of said second operational amplifier and said third operational amplifier), if the current input to the body coil is not smaller than the preset second current threshold and is not greater than the preset first current threshold, it is determined that the current input to the body coil is normal; and if not, it is determined that the current input to the body coil is abnormal; the preset second current threshold is smaller than the preset first current threshold.

5. The device as claimed in claim 1, further comprising: a second LDO and a second resistor group, wherein:
the input terminal of said second LDO is connected to the input terminal of said first LDO, and the output terminal of said second LDO is connected to the first connection terminal of said second resistor group;
the second connection terminal of said second resistor group is connected to the second connection terminal of said first resistor group;
said second LDO and said first LDO are exactly the same LDO; and
a structure of said second resistor group is exactly the same as that of said first resistor group.

6. The device as claimed in claim 5, wherein said first resistor group is formed by connecting two resistors with a same resistance in series, and a resistance of each resistor is 0.01 ohm±10%.

7. The device as claimed in claim 5, further comprising: a fourth operational amplifier, a seventh resistor, an eighth resistor, and a ninth resistor, wherein:
the first connection terminal of said seventh resistor is connected to the output terminal of said first LDO, and the second connection terminal of said seventh resistor is connected to the first connection terminal of said eighth resistor;
the first connection terminal of said eighth resistor is connected to the output terminal of said second LDO;
the non-inverting input terminal of said fourth operational amplifier is connected to the second connection terminal of said seventh resistor;
said ninth resistor is connected between the inverting input terminal and the output terminal of said fourth operational amplifier;
the resistance value of said seventh resistor is equal to that of said eighth resistor;
if the MRI system detects that a difference between the output voltage of said fourth operational amplifier and that of said first LDO is within the preset range, it is determined that the output of said first LDO is balanced with that of said second LDO; and if not, it is determined that the output of said first LDO is unbalanced with that of said second LDO.

8. The device as claimed in claim 7, wherein a resistance value of said seventh resistor is 10,000 ohm±20%.

9. The device as claimed in claim 7, wherein a resistance value of said ninth resistor is not smaller than 1000 ohm and not greater than 5000 ohm.

10. The device as claimed in claim 1, further comprising: a first logic circuit, a second logic circuit, and a MOSFET, wherein:
said first logic circuit is connected in series between the output terminal of said first operational amplifier and the gate of said MOSFET array, wherein the first input terminal of said first logic circuit is connected to the output terminal of said first operational amplifier;
the second input terminal of said first logic circuit is connected to a tuning control module;
said second logic circuit has an input terminal connected to said tuning control module and an output terminal connected to the gate of said MOSFET;
the drain of said MOSFET is connected to the source of said MOSFET array, and the source of said MOSFET receives a detuning voltage signal;
when said tuning control module outputs a high level, said first logic circuit outputs the output voltage of said first operational amplifier to the gate of said MOSFET array, and said MOSFET array is connected so that the source of said MOSFET array outputs a constant preset current to the body coil of said MRI system; meanwhile, said second logic circuit is disconnected so that said MOSFET is disconnected; and
when said tuning control module outputs a low level, said first logic circuit outputs a low level to the gate of said MOSFET array, and said MOSFET array is disconnected so the source of said MOSFET array has no current output; meanwhile, said second logic circuit is connected so that said MOSFET is connected and a detuning voltage signal is output to the body coil of said MRI system through said MOSFET.

11. The device as claimed in claim 2, wherein said negative feedback circuit comprises a first capacitor, a first resistor, and a second resistor, and wherein:
the first connection terminal of said capacitor is connected to the inverting input terminal of said first operational amplifier, and the second connection terminal of said first capacitor is connected to the first connection terminal of said first resistor;
the second connection terminal of said resistor is connected to the output terminal of said first operational amplifier;
said second resistor is connected in parallel between the first connection terminal of said first capacitor and the second connection terminal of said first resistor; and
the capacitance value of said first capacitor and the resistance values of said first resistor and said second resistor meet a requirement that after being input to the gate of said MOSFET array, the output signal of said first operational amplifier enables the source of said MOSFET array to output a constant preset current.

12. The device as claimed in claim 2, further comprising: a second operational amplifier, a third resistor, a fourth resistor, a third operational amplifier, a fifth resistor, and a sixth resistor, wherein:
the non-inverting input terminal of said second operational amplifier is connected to the output terminal of said fourth operational amplifier through said third resistor and is meanwhile grounded through said fourth resistor;

the inverting input terminal of said second operational amplifier is connected to the second connection terminal of said first resistor group;

the non-inverting input terminal of said third operational amplifier is connected to the second connection terminal of said first resistor group;

the inverting input terminal of said third operational amplifier is connected to the output terminal of said fourth operational amplifier through said fifth resistor and is meanwhile grounded through said sixth resistor;

the resistance values of said third resistor and said fourth resistor meet a requirement that an output voltage of said first LDO*resistance value of said fourth resistor/(resistance value of said third resistor+resistance value of said fourth resistor)=preset first current threshold*resistance value of body coil+voltage difference between drain and source of said MOSFET array;

the resistance values of said fifth resistor and said sixth resistor meet a requirement that an output voltage of said first LDO*resistance value of said sixth resistor/(resistance value of said fifth resistor+resistance value of said sixth resistor)=preset second current threshold*resistance value of the body coil+voltage difference between the drain and the source of said MOSFET array; and according to the output signals of said second operational amplifier and said third operational amplifier, if the current input to the body coil is not smaller than the preset second current threshold and not greater than the preset first current threshold, it is determined that the current input to the body coil is normal; and if not, it is determined that the current input to the body coil is abnormal; the preset second current threshold is smaller than the preset first current threshold.

13. The device as claimed in claim 2, further comprising: a first logic circuit, a second logic circuit, and a MOSFET, wherein:

said first logic circuit is connected in series between the output terminal of said first operational amplifier and the gate of said MOSFET array, wherein the first input terminal of said first logic circuit is connected to the output terminal of said first operational amplifier;

the second input terminal of said first logic circuit is connected to said tuning control device;

said second logic circuit has its input terminal connected to said tuning control device and its output terminal connected to the gate of said MOSFET;

the drain of said MOSFET is connected to the source of said MOSFET array, and the source of said MOSFET receives a detuning voltage signal;

when said tuning control device outputs a high level, said first logic circuit outputs an output voltage of said first operational amplifier to the gate of said MOSFET array, and said MOSFET array is connected so that the source of said MOSFET array outputs a constant preset current to the body coil of said MRI system; meanwhile, said second logic circuit is disconnected so that said MOSFET is disconnected; and when said tuning control device outputs a low level, said first logic circuit outputs a low level to the gate of said MOSFET array, and said MOSFET array is disconnected and the source of said MOSFET array has no current output; meanwhile, said second logic circuit is connected so that said MOSFET is connected and the detuning voltage signal is output to the body coil of said MRI system through said MOSFET.

14. A magnetic resonance system, comprising the body coil tuning control device as described in claim 1.

\* \* \* \* \*